(12) United States Patent
Sykora et al.

(10) Patent No.: US 7,893,410 B2
(45) Date of Patent: Feb. 22, 2011

(54) METHOD AND APPARATUS FOR PROCESSING MULTIPHOTON CURABLE PHOTOREACTIVE COMPOSITIONS

(75) Inventors: Craig R. Sykora, New Richmond, WI (US); Steven C. Reed, Stillwater, MN (US); Serge Wetzels, Maplewood, MN (US); Catherine A. Leatherdale, Woodbury, MN (US); Matthew R. C. Atkinson, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 409 days.

(21) Appl. No.: 12/158,143

(22) PCT Filed: Dec. 20, 2006

(86) PCT No.: PCT/US2006/048498
§ 371 (c)(1),
(2), (4) Date: Jun. 19, 2008

(87) PCT Pub. No.: WO2007/073482
PCT Pub. Date: Jun. 28, 2007

(65) Prior Publication Data
US 2009/0250635 A1 Oct. 8, 2009

Related U.S. Application Data
(60) Provisional application No. 60/752,529, filed on Dec. 21, 2005.

(51) Int. Cl.
*H01L 21/027* (2006.01)
*G03F 7/207* (2006.01)
(52) U.S. Cl. ............... 250/492.1; 250/492.2; 250/216; 250/221; 250/222.1; 356/445; 430/270.1; 430/325

(58) Field of Classification Search ............ 250/492.1, 250/492.2, 216, 221, 221.1; 356/445; 430/270.1, 430/325
See application file for complete search history.

(56) References Cited

U.S. PATENT DOCUMENTS 3,018,262 A   1/1962   Schroeder (Continued)

FOREIGN PATENT DOCUMENTS

WO       WO 98/21521         5/1998

(Continued)

OTHER PUBLICATIONS

Allen et al., "193 nm Single Layer Positive Resists Building Etch Resistance Into a High Resolution Imaging System," *SPIE*, vol. 2438, pp. 474-485 (1995).

(Continued)

*Primary Examiner*—Jack I Berman
(74) *Attorney, Agent, or Firm*—Kristofor L. Storvick

(57) ABSTRACT

A method including providing a substrate having thereon a layer including a multiphoton polymerizable composition, applying a light beam to at least one region of the layer, wherein the light beam cures or initiates cure of the multiphoton curable photoreactive composition; and processing a portion of the light beam reflected off the substrate to obtain a location signal of an interface between the layer and the substrate at each region.

35 Claims, 8 Drawing Sheets

U.S. PATENT DOCUMENTS

| | | | |
|---|---|---|---|
| 3,729,313 | A | 4/1973 | Smith |
| 3,741,769 | A | 6/1973 | Smith |
| 3,779,778 | A | 12/1973 | Smith et al. |
| 3,808,006 | A | 4/1974 | Smith |
| 4,250,053 | A | 2/1981 | Smith |
| 4,279,717 | A | 7/1981 | Eckberg et al. |
| 4,394,403 | A | 7/1983 | Smith |
| 4,491,628 | A | 1/1985 | Ito et al. |
| 4,642,126 | A | 2/1987 | Zador et al. |
| 4,652,274 | A | 3/1987 | Boettcher et al. |
| 4,859,572 | A | 8/1989 | Farid et al. |
| 5,235,015 | A | 8/1993 | Ali et al. |
| 5,545,676 | A | 8/1996 | Palazzotto et al. |
| 5,753,346 | A | 5/1998 | Leir et al. |
| 5,770,737 | A | 6/1998 | Reinhardt et al. |
| 5,856,373 | A | 1/1999 | Kaisaki et al. |
| 5,859,251 | A | 1/1999 | Reinhardt et al. |
| 5,998,495 | A | 12/1999 | Oxman et al. |
| 6,025,406 | A | 2/2000 | Oxman et al. |
| 6,100,405 | A | 8/2000 | Reinhardt et al. |
| 6,300,502 | B1 | 10/2001 | Kannan et al. |
| 6,713,772 | B2 * | 3/2004 | Goodman et al. ........ 250/492.1 |
| 6,855,478 | B2 | 2/2005 | DeVoe et al. |
| 2005/0254035 | A1 * | 11/2005 | Frankel ........................ 355/69 |
| 2006/0214106 | A1 * | 9/2006 | Wolleschensky et al. . 250/341.2 |
| 2009/0173893 | A1 * | 7/2009 | Tanaka et al. ............ 250/492.2 |
| 2009/0245066 | A1 * | 10/2009 | Katsuura et al. ............ 369/100 |

FOREIGN PATENT DOCUMENTS

| | | |
|---|---|---|
| WO | WO 99/53242 | 10/1999 |
| WO | WO 01/96452 | 12/2001 |
| WO | WO 01/96961 | 12/2001 |
| WO | WO 2004/110607 | 12/2004 |
| WO | WO 2007/075406 | 7/2007 |

OTHER PUBLICATIONS

Allen et al., "High performance acrylic polymers for chemically amplified photoresist applications," *J. Vac. Sci. Technol. B*, vol. 9, pp. 3357-3361 (Nov./Dec. 1991).

Beringer et al., "Diaryliodonium Salts. IX. The Synthesis of Substituted Diphenyliodonium Salts," *J. Am. Chem. Soc.*, vol. 81, pp. 342-351 (1959).

Cox, *Photographic Sensitivity*, "The Use of Electrochemical Potential Data in Studies of Spectral Sensitization," Academic Press, London and New York, pp. 241-263 (1973).

Eaton, "Dye Sensitized Photopolymerization," *Advances in Photochemistry*, vol. 13, pp. 427-488, John Wiley and Sons, New York (1986).

Lee & Neville, *Handbook of Epoxy Resins*, McGraw-Hill Book Co., New York, pp. 21-1-21-49 (1967).

Mann & Barnes, "Reduction of Hydrocarbons," *Electrochemical Reactions in Nonaqueous Systems*, Marcel Dekker, Inc., New York, pp. 31-40, 103-115, 447-453 (1970).

Mann & Barnes, "Hydrocarbon Oxidation," *Electrochemical Reactions in Nonaqueous Systems*, Marcel Dekker, Inc., New York, pp. 103-115 (1970).

Mann & Barnes, "Inorganic Compounds," *Electrochemical Reactions in Nonaqueous Systems*, Marcel Dekker, Inc., New York, pp. 447-453 (1970).

Siegerman, Oxidation and Reduction Half-Wave Potentials of Organic Compounds, *Technique of Electroorganic Synthesis Part II*, vol. V, pp. 667-675 (1975).

Xu et al., "Measurement of two-photon excitation cross sections of molecular fluorophores with data from 690 to 1050 nm," *J. Opt. Soc. Am. B*, vol. 13, No. 3, pp. 481-491 (Mar. 1996).

Zhou et al., "An Efficient Two-Photon-Generated Photoacid Applied to Positive-Tone 3D Microfabrication," *Science*, vol. 296, pp. 1106-1109 (2002).

* cited by examiner

METHOD AND APPARATUS FOR PROCESSING MULTIPHOTON CURABLE PHOTOREACTIVE COMPOSITIONS

CROSS REFERENCE TO RELATED APPLICATIONS

This application is a national stage filing under 35 U.S.C. 371 of PCT/US2006/048498, filed Dec. 20, 2006, which claims priority to U.S. Provisional Application No. 60/752,529, filed Dec. 21, 2005, the disclosure of which is incorporated by reference in its/their entirety herein.

STATEMENT OF PRIORITY

This application claims the priority of U.S. Provisional Application No. 60/752,529 filed Dec. 21, 2005, the contents of which are hereby incorporated by reference.

TECHNICAL FIELD

The invention relates to methods and apparatus for in-process detection of an interface between a multiphoton curable photoreactive composition and a substrate.

BACKGROUND

In multiphoton induced curing processes, which are described in, for example, U.S. Pat. No. 6,855,478, incorporated herein by reference, a layer including a multiphoton curable photoreactive composition is applied on a substrate such as, for example, a silicon wafer, and cured using a focused light source such as a laser beam. The multiphoton curable photoreactive composition in the applied layer includes at least one reactive species that is capable of undergoing an acid or radical initiated chemical reaction, as well as a multiphoton initiator system. Imagewise exposure of the layer with light of an appropriate wavelength and sufficient intensity causes two-photon absorption in the multiphoton initiator system, which induces in the reactive species an acid or radical initiated chemical reaction in a region of the layer that is exposed to the light. This chemical reaction causes crosslinking, polymerization or a change in solubility characteristics in the exposed region, referred to herein as curing, to form a cured object. Following the curing step, the layer may optionally be developed by removing a non-cured portion of the layer to obtain the cured object, or by removing the cured object itself from the layer.

The layer including the multiphoton curable photoreactive composition typically has a relatively uniform thickness of about 10-500 µm, and curing can occur at any location within this layer to form a cured object. However, to make sure the cured object is attached to the substrate, the curing process should be started at an interface between the curable composition and the substrate. The accuracy with which this interface should be located varies widely depending on the particular cured structure that is to be made, but typically the interface should be located within a range of about 100 nm to 1 µm.

Conventional multiphoton curing processes have utilized a surface mapping technique in which the entire substrate surface is mapped in advance of the curing step to locate the interface between the substrate and the layer including the multiphoton curable photoreactive composition. In the alternative, a second light beam, different from the light beam used to cure or initiate cure in the layer including the multiphoton curable photoreactive composition, has been used to track the changes in the substrate surface and locate this interface. However, these techniques do not take into account environmental changes and process variations that occur between the time the surface measurement is made and the initiation of the curing process, or while the curing process is underway. As a result, the interface location information these processes provide is not sufficiently accurate, particularly in a process used to make large cured objects with a size of greater than about 1 $cm^2$.

SUMMARY

Referring to FIG. 1A, a structure 10 is shown that includes a substrate 12 with a layer 14 of a multiphoton curable photoreactive composition thereon. If the light beam initiating the curing reaction is aimed at a region in the layer 14 at a depth above an interface 17 between the layer 14 and the substrate 12, the resulting cured object 16 will be built too high, and the object 16 will be rinsed away during the development process. As shown in FIG. 1B, if the light beam initiating the curing reaction is aimed at a region in the layer 24 at a depth below the interface 27 between the layer 24 and the substrate 22, the beam is focused where there is no photopolymerizable material, and a portion 28 of the resulting cured object 26 will not be formed. Referring to FIG. 1C, if the light beam initiating the curing reaction is aimed at a region in the layer 34 having a proper depth, the resulting structure 36 will be formed adjacent to the interface 37 between the substrate 32 and the composition layer 34. Given the fact that multiphoton polymerized structures can be as small as a few microns in size, and the structure should only intersect with the substrate for positive attachment along a small portion of its overall height, the process window for locating the interface 37 in FIG. 1C is very small.

In addition, locating the interface between the multiphoton curable photoreactive composition and the substrate is further complicated by irregularities in the surface of the substrate on which the composition layer is applied. For example, the surface roughness of the substrate may vary in different areas, the substrate may be tilted or curved, the substrate may move slightly during the curing process, or temperature changes during the curing process may cause thermal drift. These substrate irregularities become more troublesome in processes where cured objects having a size of greater than about 1 $cm^2$ are made, as properties of the substrate surface may vary widely over such a large area.

In one aspect, the present disclosure is directed to an in situ method for locating and/or tracking the interface between a multiphoton curable photoreactive composition and a substrate, which allows for more accurate curing processes. In one embodiment, this method includes providing a substrate having thereon a layer of a multiphoton curable photoreactive composition, applying a light beam to at least one region of the layer, wherein the light beam cures or initiates cure of the multiphoton curable photoreactive composition; and processing a portion of the light beam reflected off the substrate to obtain a location signal of an interface between the layer and the substrate at each region.

In another aspect, this disclosure is directed to a method including providing a substrate having thereon a layer including a multiphoton curable photoreactive composition; applying through a first optical system a light beam to at least a first region of the layer; reflecting a portion of the light beam off the substrate at each first region to provide a reflected light beam; processing the reflected light beam at each first region in a second optical system including an optical detector, wherein an output of the optical detector includes a location signal of an interface between the substrate and the layer at each first region; adjusting the first optical system in response to the location signal; and applying through the first optical system the light beam to cure the composition in a curing region.

In another aspect, the disclosure is directed to a method including providing a layer on a substrate, wherein the layer comprises a multiphoton curable photoreactive composition, and wherein the substrate is on an adjustable platform; applying through a first optical system a light beam to the layer in at least a first region; processing the light beam in a second optical system including an optical detector, wherein an output of the optical detector includes a location signal for an interface between the substrate and the layer at each region; adjusting at least one of the first optical system and the platform in response to the signal; and curing the composition with the light beam in a curing region.

In yet another aspect, the present disclosure is directed to a computer readable medium including instructions for causing a processor to receive a location signal of an interface between a substrate and at least one region of a layer including a multiphoton polymerizable composition, wherein the location signal is generated by applying a focused light beam to the layer through a first optical system and processing in an optical detector a portion of the focused light beam reflected off the substrate; generate a combined location signal based on the location signals generated at each region; and adjust, based on the combined location signal, at least one of the first optical system and a platform supporting the substrate.

In another aspect, the present disclosure is directed to an apparatus for curing a region of a layer including a multiphoton curable photoreactive composition, wherein the apparatus includes a first optical system that directs a first portion of a focused laser beam into the layer, and a second optical system that processes a second portion of the beam as reflected off the substrate to produce an output signal of an interface between the substrate and the layer.

The interface location signal may be used to adjust the light beam as a region of the layer of multiphoton curable photoreactive material is cured to make a first object, may be used to continuously adjust the curing light beam as multiple objects are made, or may be used to make a second object adjacent the first object. Since the location signal is obtained and utilized by the apparatus immediately prior to or as curing is initiated, environmental and substrate surface variations have substantially less impact on the curing process compared to conventional measurement techniques which have a significant time lag between generation of the interface location information and the curing step.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

In the drawings, like symbols indicate like elements.

DETAILED DESCRIPTION

Figure 1A:
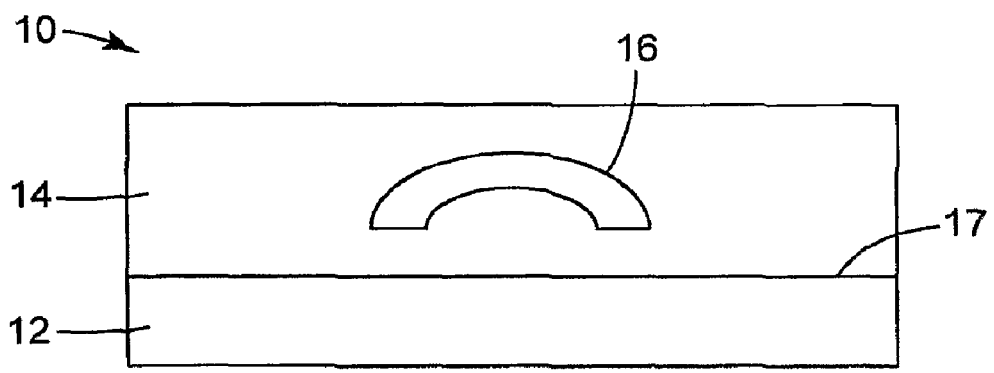
FIGS. 1A-1C are schematic cross-sectional diagrams of objects made by curing a layer including a multiphoton curable photoreactive composition adjacent a substrate.
Figure 1B:
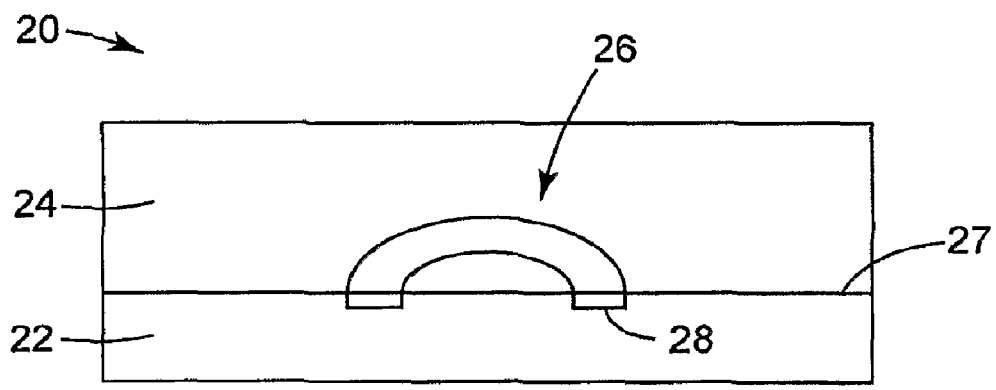
Figure 1C:
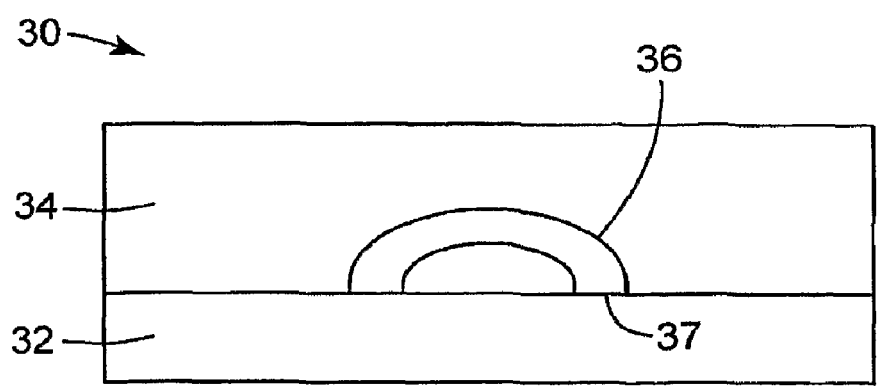
Figure 2:
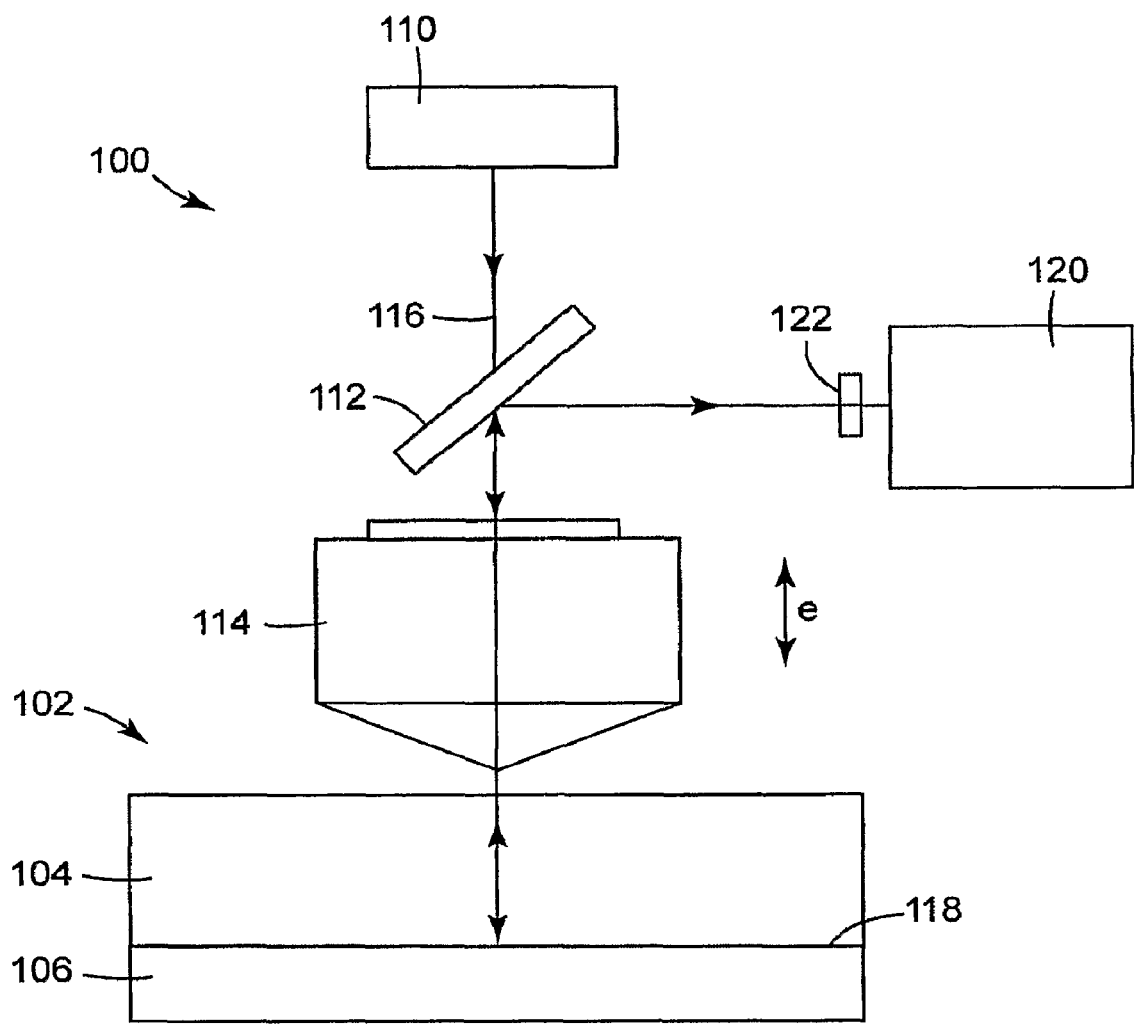
FIG. 2 is a schematic diagram of an apparatus used for curing a multiphoton curable photoreactive material.

Referring to FIG. 2, an apparatus 100 is shown that may be used to accurately cure a selected region 102 of a layer 104 applied to a substrate 106. The layer 104 includes a multiphoton curable photoreactive composition, and this composition will be discussed in detail below. In carrying out the process of the invention, a photoreactive composition can be exposed to light under conditions such that multiphoton absorption occurs, which causes in a region of the layer a change in chemical or physical properties. Examples of such changes includes polymerization, crosslinking, and/or a change in solubility characteristics (for example, lesser or greater solubility in a particular solvent) as compared to the photoreactive composition prior to exposure. Such exposure can be accomplished by any known means capable of achieving sufficient intensity of the light, but a focused light source from a laser is typically used.

The apparatus 100 includes a first optical system with a light source 110, typically a laser, a beam splitter 112, and a focusing positive lens 114. A light beam 116 emitted from the light source 110 enters the beam splitter 112, is focused by the lens 114, and then enters the layer 104 that includes the multiphoton curable photoreactive material. As the positive 114 is moved downward along the z direction with respect to the layer 104 and the substrate 106, the focal point of the beam 116 likewise moves downward through the thickness of the layer 104. If desired the light beam 116 may be adjusted to have an appropriate wavelength and a sufficient intensity such that at the focal point the beam cures the multiphoton curable photoreactive material in any area of the region 102 of the layer 104. Whether or not the layer 104 is cured in the region 102, a portion of the light beam 116 that enters the layer 104 is reflected at an interface 118 between the layer 104 and the substrate 106. After being reflected from the interface 118 the beam 116 enters a second optical system that includes the lens 114, the beam splitter 112, and a detector 120.

Figure 3:
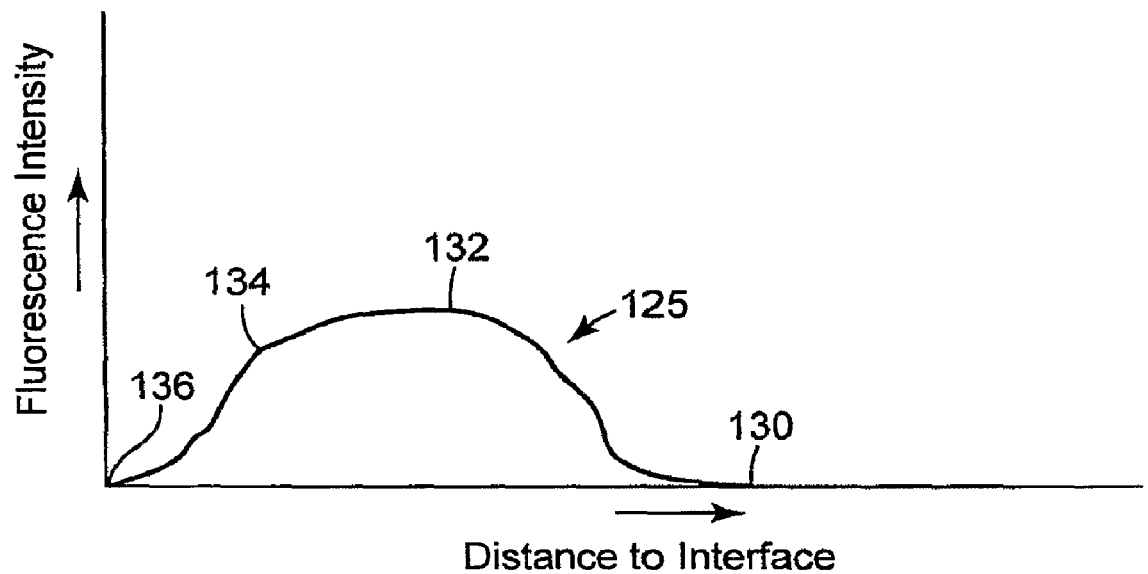
FIG. 3 is a plot of fluorescence intensity vs. distance to the interface between the substrate 106 and the layer 104 in FIG. 2.

The detector 120 may vary widely depending on the intended application, and in one embodiment includes a fluorescence detector, which in the simplest case may be the naked human eye. As the focal point of the light beam 116 traverses down through the layer 104 toward the interface 118, a change in the intensity of the fluorescence emanating from the curing process can be observed, and this change in intensity may be used to determine when the focal point of the beam 116 is located at the interface 118. Referring to FIGS. 2-3, as the positive lens 116 moves downward along the z direction, the focal point of the beam 116 enters the layer 104 (see 130 on curve 125 in FIG. 3). The fluorescence intensity initially increases and then remains relatively constant once the focal point of the beam 116 is fully inside the layer 104

(see 132 in FIG. 3). Once the focal point of the beam 116 encounters the interface 118 between the layer 104 and the substrate 106, the fluorescence intensity drops off rapidly (see 134 in FIG. 3) until the fluorescence signal is effectively extinguished at the point where the beam 116 is completely focused within the substrate 106 (see 136 in FIG. 3).

When the focal point of the beam 116 is at the interface 118, the fluorescence intensity is somewhere on the curve 125 between points 134 and 136. Therefore, there is no clear and unambiguous point along the curve 125, such as a fluorescence intensity minimum or maximum, that may be detected to accurately determine when the focal point of the beam 116 is at the interface 118. A further complicating factor in determining a consistent level of fluorescence is the varying levels of exposure that may be used in curing the multiphoton curable photoreactive material in the layer 104. Depending on the multiphoton curable photoreactive material in the layer 104, as well as on the type of cured object to be made using the curing process, the total laser power, and, as a result, the total fluorescence, can vary greatly. Thus, the range of locations along the z direction for the positive lens 114 that correspond to the required drop off of intensity between points 134 and 136 on curve 125 in FIG. 3 also vary widely.

Further, determining the location of the interface 118 using fluorescence intensity also requires moving the positive lens 114 along the z direction and traversing the layer 104 multiple times. If these multiple traversals are performed in the same region 102 of the layer 104, the photoinitiator in the multiphoton curable photoreactive material in that region is depleted, which causes a decrease in fluorescence. To overcome this problem the region 102 of the substrate 106 may be indexed to another region to find fresh curable material, but such an indexing procedure introduces wafer flatness variations into the process, which has an adverse impact on the accuracy of the procedure.

Thus, while detection of fluorescence intensity is useful, the relative lack of accuracy and predictability make the use of this procedure less preferred when a high level of precision is required. However, the low cost and simplicity of fluorescence detection makes the above described procedure a viable option for applications in which a relatively rough estimate of the location of the interface 118 is desired.

Figure 4:
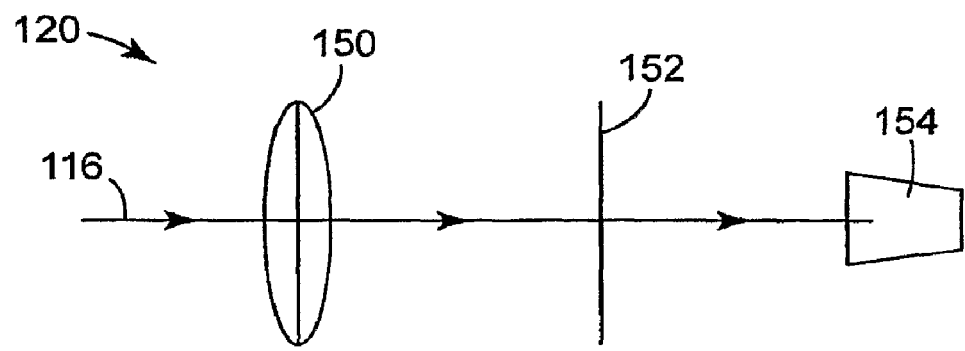
FIG. 4 is schematic diagram of a confocal interface locator system that may be used in the apparatus of FIG. 2.

Referring to FIG. 4, another embodiment is shown of the detector 120 in the apparatus in FIG. 2. The detector 120 shown in FIG. 4, which will be referred to herein as a confocal interface locator system, includes a positive lens 150 that focuses the incoming light beam 116, a pinhole 152, and a detector 154, typically a photomultiplier tube (PMT). The confocal interface locator system 120 is a spatial filter, and only allows the light beam 116 to pass through the pinhole 152 if the beam originates from the focal point of the lens 114 (see FIG. 2). Therefore, only reflections that occur at the focal point of the positive lens 114 will be captured and passed on to the PMT 154. There will be a signal on the PMT 154 only when the focal point crosses the interface 118 between the layer 104 and the substrate 106 (see FIG. 2).

The spatial filtering effect of the confocal interface locator system 120 of FIG. 4 creates a sharp peak signal when the focal point of the positive lens 114 crosses the interface 118. This peak can be clearly and unambiguously detected, and the correlation between the occurrence of the peak and the location of the interface 118 will not be affected by the power of the laser 110, losses in the first or second optical systems, or characteristics of the confocal interface locator system 120 itself. In addition, the confocal interface locator system 120 does not rely on fluorescence, and to provide an even more definite reading of the location of the interface 118, a filter 122 (FIG. 2) may optionally be included to remove the fluorescent wavelengths from the light beam 116 before the beam enters the detector 120. Even of there is no layer 104 on the substrate 106, the interface 118 may still be accurately located, so to locate the interface it is not necessary to deplete the photoinitiator in the layer 104.

Since the apparatus shown in FIGS. 2 and 4 utilizes the same positive lens 114 that is used to focus the light beam 116 in the layer 104, and the interface location signal is received by the detector 120 at the same time or immediately preceeding the cure step in the region 102 of layer 104, the interface location information obtained by the detector 120 is highly accurate. Using the apparatus of FIG. 4 and the method described above, it is possible to determine the location of the interface 118 within a range of about 100 nm to 1 μm. The interface location information may be used to maintain the position of the positive lens 114 as the multiphoton curable photoreactive material in a first region of the layer 104 is cured to form a first cured object, or may be used to position the positive lens 114 to form a another cured object in another region of the layer 104 different from the first region.

Figure 5:
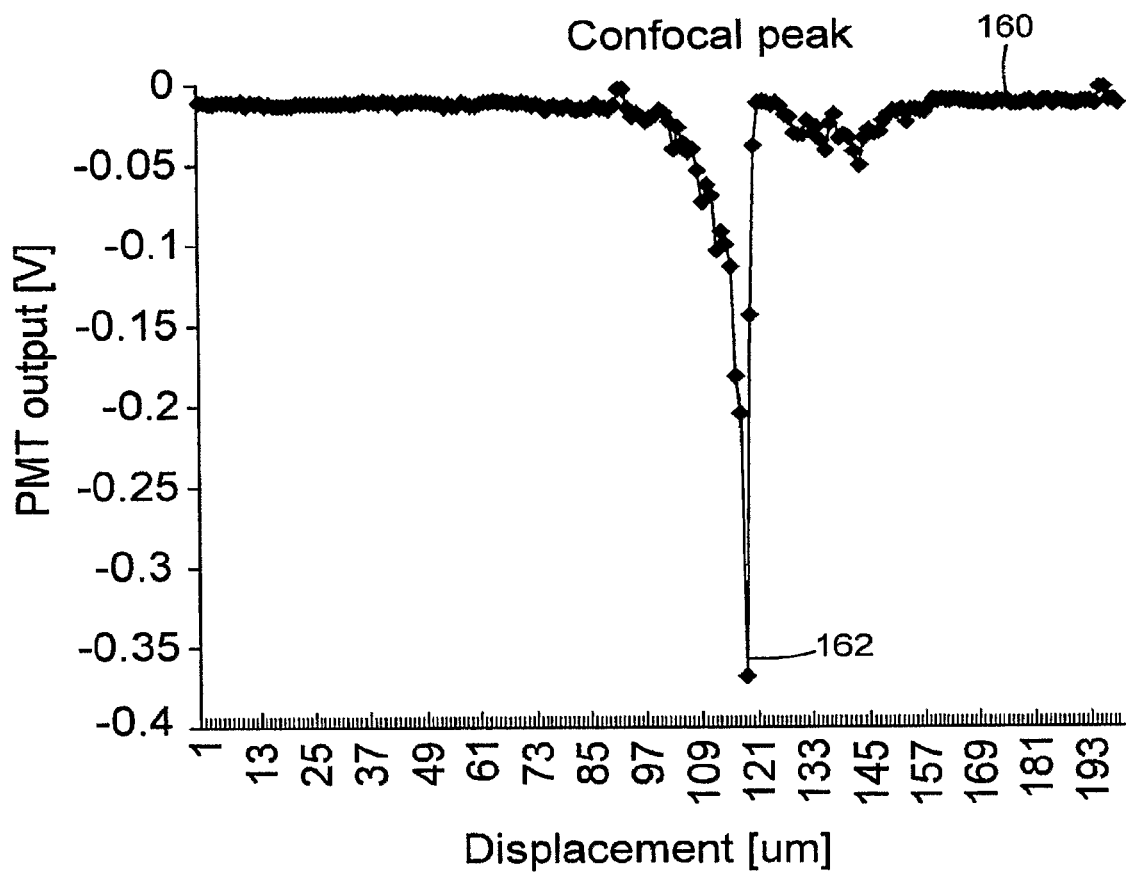
FIG. 5 is a plot of displacement along the z direction vs. PMT output for the apparatus of FIG. 2 using the system and detector of FIG. 4.

A typical response curve 160 for the confocal microscope detector of FIG. 4 is shown in FIG. 5. The sharp peak 162 in the output signal of the PMT corresponds to the location of the interface 118 between the layer 104 and the substrate 106.

Figure 6:
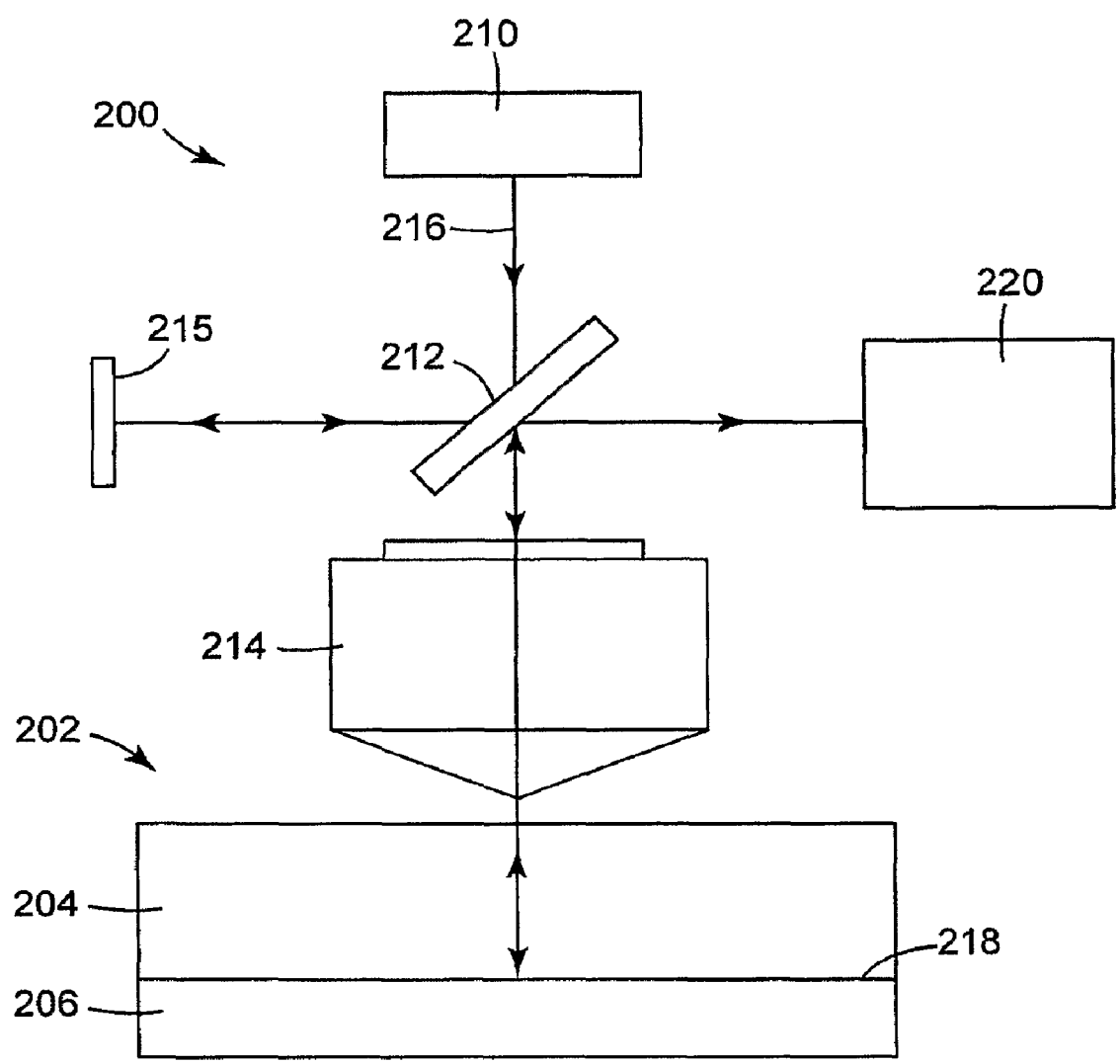
FIG. 6 is a schematic diagram of an apparatus for curing a multiphoton curable photoreactive material including an interferometric detector.

Referring to FIG. 6, another embodiment of an apparatus 200 is shown that may be used to cure a region 202 of a layer 204 including a multiphoton curable photoreactive material. A light beam 216 emitted by a short coherence light source 210 such as, for example, a collimated arc lamp, initially traverses a first optical system including a beam splitter 212 and a focusing positive lens 214. The beam 216 optionally cures or initiates cure of the multiphoton curable photoreactive material in the region 202 of the layer 204. A portion of the beam 216 is then reflected from an interface 218 between the layer 204 and a substrate 206, and enters a second optical system including the positive lens 214, the beamsplitter 212, and a mirror 215. The light reflected from the mirror 215 again passes through the beamsplitter 212 and enters a detector 220 such as a PMT. When the focal point of the positive lens 214 is located at the interface 218, constructive interference among the light waves traversing the first and second optical systems produces a strong signal at the detector 220. If the focal point of the positive lens 214 is not located at the interface 218, destructive interference among the light waves traversing the first and second optical systems produces a relatively weaker signal at the detector 220.

Figure 7:
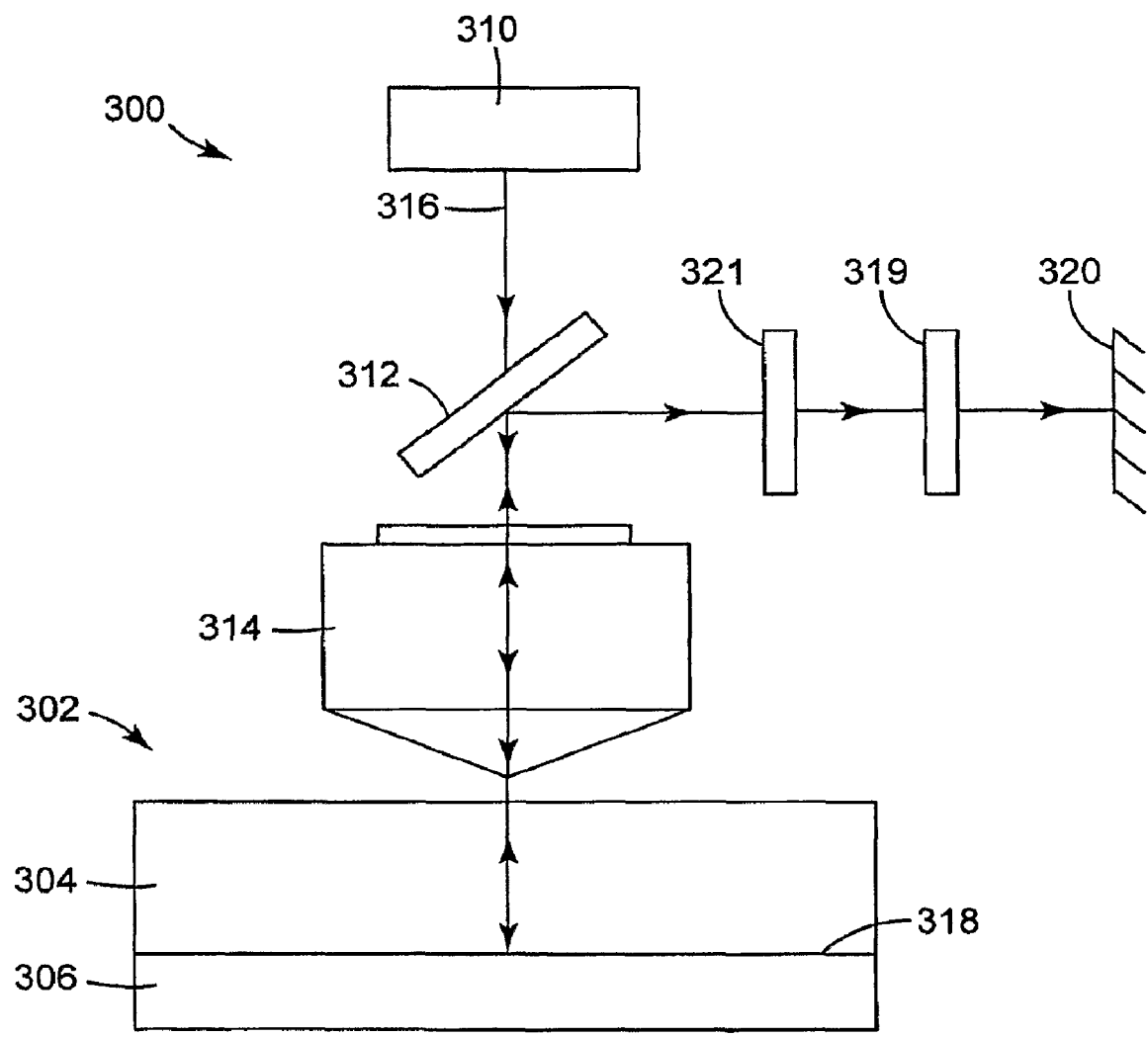
FIG. 7 is a schematic diagram of an apparatus for curing a multiphoton curable photoreactive material including a split detector focus measurement system.

In yet another embodiment shown in FIG. 7, a split detector focus measurement system and apparatus 300 is shown that may be used to cure a region 302 of a layer 304 including a multiphoton curable photoreactive material. A light beam 316 emitted from a collimated source 310 traverse a first optical system including a beam splitter 312 and a focusing objective 314. The beam 316 optionally cures or initiates cure of a multiphoton curable photoreactive material in the region 302 of the layer 304. A portion of beam 316 is then reflected from an interface 318 between the layer 304 and a substrate 306, and enters a second optical system including the objective 314, the beamsplitter 312, an opaque screen 321 that blocks half the beam, a focusing lens 319 and a split detector 320. When the beam is focused the interface 318 between layer 304 and substrate 306, then the resultant beam is located at the center of the split detector 320. The difference in signal between the two sides of the split detector will be zero. When the beam is focused above or below the interface 318 between layer 304 and substrate 306, then the resultant beam will be focused more on one side or the other of the split detector. The difference in signal between the two sides of the split detector will be non-zero, with the magnitude indicating the amount of defocus, and the sign of the difference signal indicating the direction of defocus.

Figure 8:
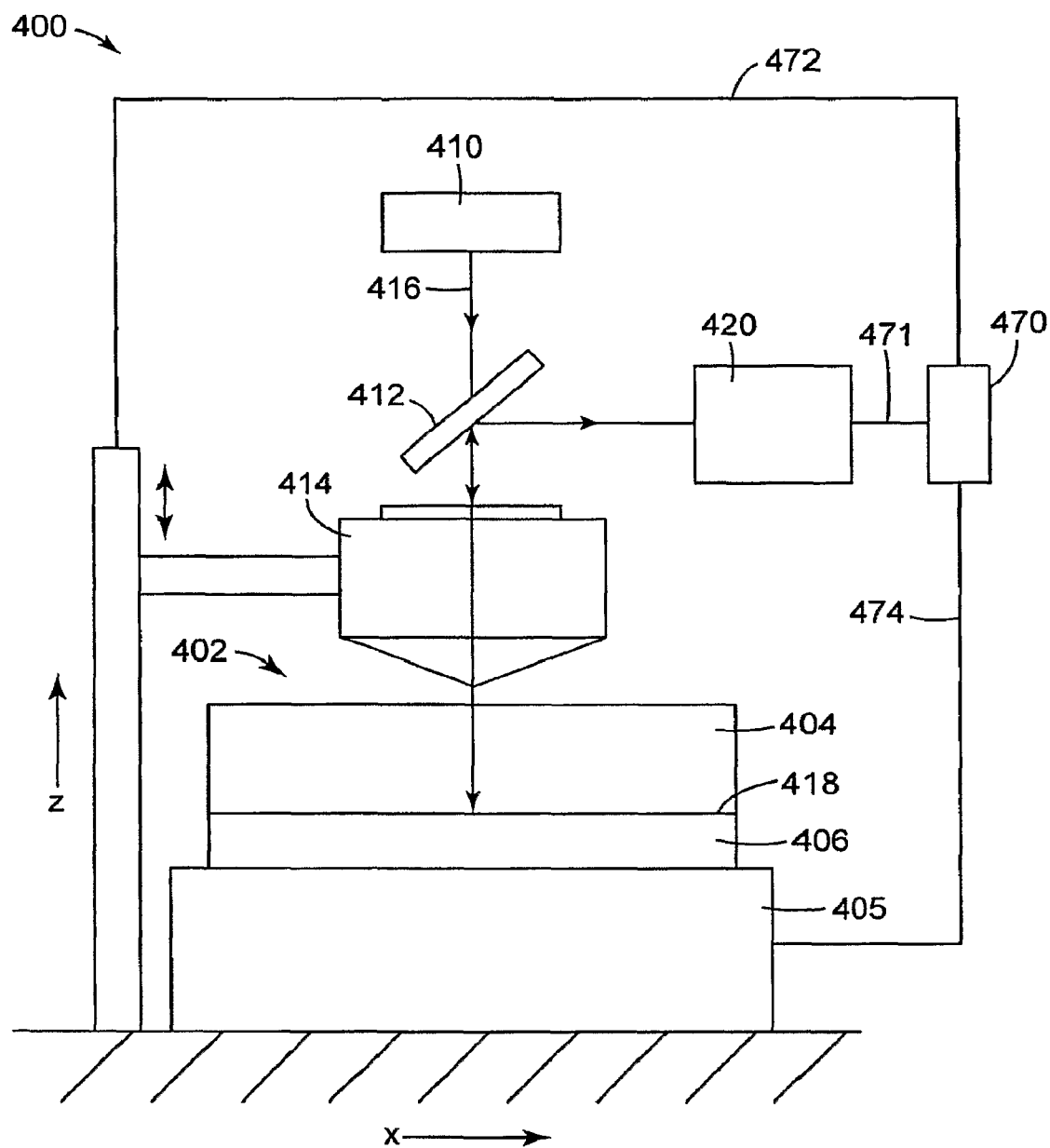
FIG. 8 is a schematic diagram of an apparatus for curing a multiphoton curable photoreactive material including a statically or dynamically adjustable positive lens and stage.

Referring to FIG. 8, an apparatus 400 is shown that may be used to cure a region 402 of a layer 404 including a multiphoton curable photoreactive material. The layer 404 is applied to a substrate 406, and the substrate 406 rests on an adjustable platform or stage 405. The height of the stage 405 along the z direction, as well as the tilt above or below the x-y plane of the layer 404, is adjustable manually or by digital computer 470 via a control line 472. A light beam 416 emitted from a focused source 410 initially traverses a first optical system including a beamsplitter 412 and a focusing positive lens 414. The height of the focusing positive lens 414 along the z direction is also adjustable manually or by the digital computer 470 via a control line 474. After leaving the positive lens 414 the light beam 416 enters the layer 404, optionally cures or initiates cure of the multiphoton curable photoreactive material in the region 402 of the layer 404, and a portion thereof is reflected off the substrate 406 at an interface 418. The light beam 416 then enters a second optical system including the positive lens 414 and a detector 420. The detector 420 may be a confocal interface locator system 120 as shown in FIGS. 2 and 4, an interferometric detection system as shown in FIG. 6, or a split detector as shown in FIG. 7.

Figure 9:
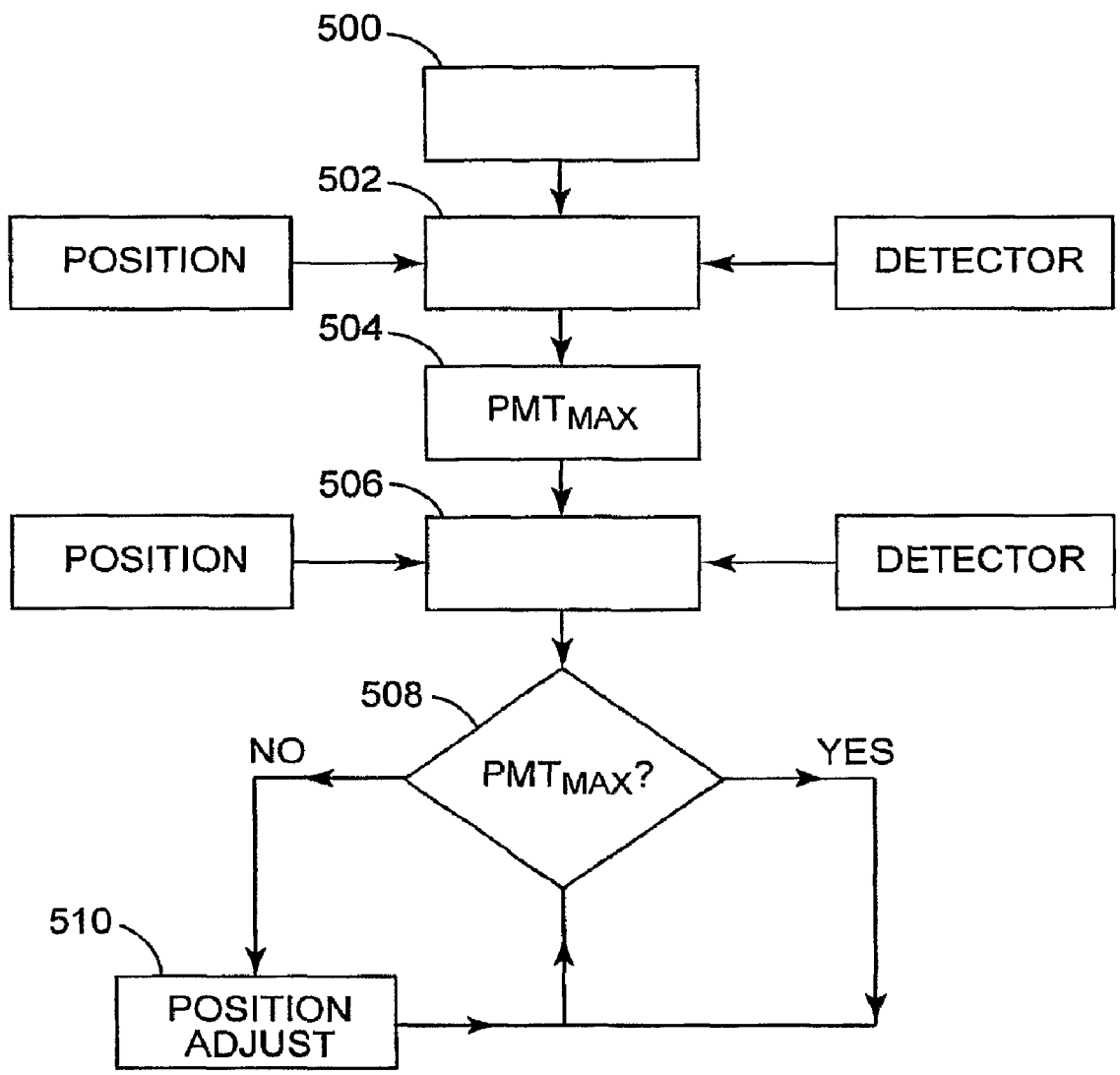
FIG. 9 is a flow chart showing the operation of the computer processor in the apparatus of FIG. 8.

The output of the detector 420 is then provided to the digital computer 470 along line 471. Referring also to FIG. 9, after initializing at step 500, the computer 470 receives at step 502 position data from the positive lens 414 and the adjustable stage 405, as well as data from the detector 420. In step 504, the computer 470 correlates the signal from the detector with the height of the positive lens 414 along the z direction with respect to the interface 418, as well as with the tilt of the stage 405. For example, as shown in FIG. 9, if the detector 470 is a confocal interface locator system and with a PMT, the maximum output of the PMT can be correlated with a location of the positive lens 414 along the z direction that corresponds where the focal point of the positive lens 414 lies at the interface 418 between the layer 404 and the substrate 406. In step 506, position data and detector data are input to the computer 470, and in step 508 the computer evaluates the detector data to determine whether the PMT signal is at the maximum. If yes, the position of the positive lens 414 along the z direction is unchanged. If no, in step 510 the computer adjusts the height of the positive lens 414 along the z axis until the PMT signal is again at a maximum value.

Using this continuous feed back system, the above described method and apparatus can be used to accurately find the interface 418 in a number of ways. For example, in a static method, the detector 470 is used as an optical probe to sample the layer 404/substrate 406 interface at several different spots, typically at least three spots, on the surface of the substrate 406. If the position of the positive lens 414 along the z axis with respect to the location of the interface 418 is not within about ±0.5 μm for all sampled location on the substrate 406, the computer 470 performs the necessary calculations to adjust either the positive lens 414 and/or the stage 405. Once the substrate 406 is sufficiently level to the plane of motion along the x axis underneath the positive lens 414; the region 402 of the layer 404 can be cured using the light beam 416. This method can only be used on substrates that are sufficiently flat since only the tilt of the substrate with respect to the x-y plane can be corrected.

A dynamic method may also be used to provide continuous feedback on the location of the interface 418 as the positive lens 414 moves and the multiphoton curable photoreactive material in the layer 404 is cured to form an object. This method can correct for any unflatness in the surface of the substrate 406 since the position of the positive lens 414 along the z axis is continuously corrected as curing proceeds from a first region of the layer 404 to a second region and so on. This continuous dynamic feedback also makes it possible to build structures on top of nominally non-flat surfaces such as spheres and aspheres.

The multiphoton curable photoreactive compositions useful in the processes described herein are discussed in detail in copending and cofiled application with 3M, incorporated herein by reference in its entirety.

The multiphoton curable photoreactive composition in the applied layer includes at least one reactive species that is capable of undergoing an acid or radical initiated chemical reaction, as well as a multiphoton initiator system. Imagewise exposure of the layer with light of an appropriate wavelength and sufficient intensity causes two-photon absorption in the multiphoton initiator system, which induces in the reactive species an acid or radical initiated chemical reaction in a region of the layer that is exposed to the light. This chemical reaction causes a detectable change in the chemical or physical properties in the region of the layer that is exposed to the light. Examples of detectable changes include, for example, crosslinking, polymerization or a change in solubility characteristics in the exposed region. The occurrence of any of these detectable changes is referred to herein as curing, and the curing continues until a cured object is formed. The curing step may take place in any area within the layer including the multiphoton photoreactive composition, including adjacent the interface with the substrate on which the layer is applied. Following the curing step, the layer may optionally be developed by removing a non-cured portion of the layer to obtain the cured object, or by removing the cured object itself from the layer.

Reactive Species

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethyl-methane, trishydroxyethyl-isocyanurate trimethacrylate, the bis-acrylates and bis-methacrylates of polyethylene glycols of molecular weight about 200-500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth) acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Other epoxy-containing materials that are useful include glycidyl ether monomers of the formula

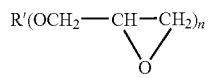

where R' is alkyl or aryl and n is an integer of 1 to 8. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

A number of commercially available epoxy monomers or resins can be used. Epoxides that are readily available include, but are not limited to, octadecylene oxide; epichlorohydrin; styrene oxide; vinylcyclohexene oxide; glycidol; glycidyl methacrylate; diglycidyl ethers of bisphenol A (for example, those available under the trade designations "EPON 815C", "EPON 813", "EPON 828", "EPON 1004F", and "EPON 1001F" from Hexion Specialty Chemicals, Inc., Columbus, Ohio); and diglycidyl ether of bisphenol F (for example, those available under the trade designations "ARALDITE GY281" from Ciba Specialty Chemicals Holding Company, Basel, Switzerland, and "EPON 862" from Hexion Specialty Chemicals, Inc.). Other aromatic epoxy resins include the SU-8 resins available from MicroChem. Corp., Newton, Mass.

Other exemplary epoxy monomers include vinyl cyclohexene dioxide (available from SPI Supplies, West Chester, Pa.); 4-vinyl-1-cylcohexene diepoxide (available from Aldrich Chemical Co., Milwaukee, Wis.); 3,4-epoxycyclohexylmethyl-3,4-epoxycyclohexene carboxylate (for example, one available under the trade designation "CYRACURE UVR-6110" from Dow Chemical Co., Midland, Mich.); 3,4-epoxy-6-methylcylcohexylmethyl-3,4-epoxy-6-methyl-cylcohexane carboxylate; 2-(3,4-epoxycyclohexyl-5,5-spiro-3,4-epoxy)cyclohexane-metadioxane; bis(3,4-epoxycyclohexylmethyl) adipate (for example, one available under the trade designation "CYRACURE UVR-6128" from Dow Chemical Co.); bis(3,4-epoxy-6-methylclyclohexylmethyl)adipate; 3,4-epoxy-6-methylcyclohexane carboxylate; and dipentene dioxide.

Still other exemplary epoxy resins include epoxidized polybutadiene (for example, one available under the trade designation "POLY BD 605E" from Sartomer Co., Inc., Exton, Pa.); epoxy silanes (for example, 3,4-epoxycylcohexylethyltrimethoxysilane and 3-glycidoxypropyltrimethoxysilane, commercially available from Aldrich Chemical Co., Milwaukee, Wis.); flame retardant epoxy monomers (for example, one available under the trade designation "DER-542", a brominated bisphenol type epoxy monomer available from Dow Chemical Co., Midland, Mich.); 1,4-butanediol diglycidyl ether (for example, one available under the trade designation "ARALDITE RD-2" from Ciba Specialty Chemicals); hydrogenated bisphenol A-epichlorohydrin based epoxy monomers (for example, one available under the trade designation "EPONEX 1510" from Hexion Specialty Chemicals, Inc.); polyglycidyl ether of phenol-formaldehyde novolak (for example, one available under the trade designation "DEN-431" and "DEN-438" from Dow Chemical Co.); and epoxidized vegetable oils such as epoxidized linseed and soybean oils available under the trade designations "VIKOLOX" and "VIKOFLEX" from Atofina Chemicals (Philadelphia, Pa.).

Additional suitable epoxy resins include alkyl glycidyl ethers commercially available from Hexion Specialty Chemicals, Inc. (Columbus, Ohio) under the trade designation "HELOXY". Exemplary monomers include "HELOXY MODFIER 7" (a $C_8$-$C_{10}$ alky glycidyl ether), "HELOXY MODIFIER 8" (a $C_{12}$-$C_{14}$ alkyl glycidyl ether), "HELOXY MODIFER 61" (butyl glycidyl ether), "HELOXY MODIFER 62" (cresyl glycidyl ether), "HELOXY MODIFER 65" (p-tert-butylphenyl glycidyl ether), "HELOXY MODIFER 67" (diglycidyl ether of 1,4-butanediol), "HELOXY 68" (diglycidyl ether of neopentyl glycol), "HELOXY MODIFER 107" (diglycidyl ether of cyclohexanedimethanol), "HELOXY MODIFER 44" (trimethylol ethane triglycidyl ether), "HELOXY MODIFIER 48" (trimethylol propane triglycidyl ether), "HELOXY MODIFER 84" (polyglycidyl ether of an aliphatic polyol), and "HELOXY MODIFER 32" (polyglycol diepoxide).

Other useful epoxy resins comprise copolymers of acrylic acid esters of glycidol (such as glycidyl acrylate and glycidyl methacrylate) with one or more copolymerizable vinyl compounds. Examples of such copolymers are 1:1 styrene-glycidyl methacrylate and 1:1 methyl methacrylate-glycidyl acrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg et al.), which are commercially available from the General Electric Company. These are polydimethylsiloxanes in which 1-20 mole % of the silicon atoms have been substituted with epoxyalkyl groups (preferably, epoxy cyclohexylethyl, as described in U.S. Pat. No. 5,753,346 (Leir et al.).

Blends of various epoxy-containing materials can also be utilized. Such blends can comprise two or more weight average molecular weight distributions of epoxy-containing compounds (such as low molecular weight (below 200), intermediate molecular weight (about 200 to 1000), and higher molecular weight (above about 1000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (for example, the EPON resins available from Hexion Specialty Chemicals, Inc. and the SU-8 resins available from MicroChem. Corp., Newton, Mass.), and the like, and mixtures thereof. More preferred are the SU-8 resins and mixtures thereof.

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (RAPI-CURE DVE-3, available from International Specialty Products, Wayne, N.J.), trimethylolpropane trivinyl ether, and the VECTOMER divinyl ether resins from Morflex, Inc., Greensboro, N.C. (for example, VECTOMER 1312, VECTOMER 4010, VECTOMER 4051, and VECTOMER 4060 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid- to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

If desired, mixtures of different types of reactive species can be utilized in the photoreactive compositions. For example, mixtures of free-radically-reactive species and cationically-reactive species are also useful.

Photoinitiator System

The photoinitiator system is a multiphoton photoinitiator system, as the use of such a system enables polymerization to be confined or limited to the focal region of a focused beam of light. Such a system preferably is a two- or three-component system that comprises at least one multiphoton photosensitizer, at least one photoinitiator (or electron acceptor), and, optionally, at least one electron donor. Such multi-component systems can provide enhanced sensitivity, enabling photoreaction to be effected in a shorter period of time and thereby reducing the likelihood of problems due to movement of the sample and/or one or more components of the exposure system.

Preferably, the multiphoton photoinitiator system comprises photochemically effective amounts of (a) at least one multiphoton photosensitizer that is capable of simultaneously absorbing at least two photons and that, optionally but preferably, has a two-photon absorption cross-section greater than that of fluorescein; (b) optionally, at least one electron donor compound different from the multiphoton photosensitizer and capable of donating an electron to an electronic excited state of the photosensitizer; and (c) at least one photoinitiator that is capable of being photosensitized by accepting an electron from an electronic excited state of the photosensitizer, resulting in the formation of at least one free radical and/or acid.

Alternatively, the multiphoton photoinitiator system can be a one-component system that comprises at least one photointitator. Photoinitiators useful as one-component multi-photon photoinitiator systems include acyl phosphine oxides (for example, those sold by Ciba under the trade name Irgacure™ 819, as well as 2,4,6 trimethyl benzoyl ethoxyphenyl phosphine oxide sold by BASF Corporation under the trade name Lucirin™ TPO-L) and stilbene derivatives with covalently attached sulfonium salt moeties (for example, those described by W. Zhou et al. in Science 296, 1106 (2002)). Other conventional ultraviolet (UV) photoinitiators such as benzil ketal can also be utilized, although their multi-photon photoinitiation sensitivities will generally be relatively low.

Multiphoton photosensitizers, electron donors, and photoinitiators (or electron acceptors) useful in two- and three-component multiphoton photoinitiator systems are described below.

(1) Multiphoton Photosensitizers

Multiphoton photosensitizers suitable for use in the multiphoton photoinitiator system of the photoreactive compositions are those that are capable of simultaneously absorbing at least two photons when exposed to sufficient light. Preferably, the photosensitizers have a two-photon absorption cross-section greater than that of fluorescein (that is, greater than that of 3',6'-dihydroxyspiro[isobenzofuran-1(3H), 9'-[9H]xanthen]3-one). Generally, the preferred cross-section can be greater than about $50\times10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18-22).

More preferably, the two-photon absorption cross-section of the photosensitizer is greater than about 1.5 times that of fluorescein (or, alternatively, greater than about $75\times10^{-50}$ cm$^4$ sec/photon, as measured by the above method); even more preferably, greater than about twice that of fluorescein (or, alternatively, greater than about $100\times10^{-50}$ cm$^4$ sec/photon); most preferably, greater than about three times that of fluorescein (or, alternatively, greater than about $150\times10^{-50}$ cm$^4$ sec/photon); and optimally, greater than about four times that of fluorescein (or, alternatively, greater than about $200\times10^{-50}$ cm$^4$ sec/photon).

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313.

Preferably, a photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride or hexafluoroantimonate) and the four classes of photosensitizers described, for example, by Marder and Perry et al. in International Patent Publication Nos. WO 98121521 and WO 99/53242. The four classes can be described as follows: (a) molecules in which two donors are connected to a conjugated π (pi)-electron bridge; (b) molecules in which two donors are connected to a conjugated π (i)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

The four above-described classes of photosensitizers can be prepared by reacting aldehydes with ylides under standard Wittig conditions or by using the McMurray reaction, as detailed in International Patent Publication No. WO 98/21521.

Other compounds are described by Reinhardt et al. (for example, in U.S. Pat. Nos. 6,100,405, 5,859,251, and 5,770,737) as having large multiphoton absorption cross-sections, although these cross-sections were determined by a method other than that described above.

Preferred photosensitizers include the following compounds (and mixtures thereof):

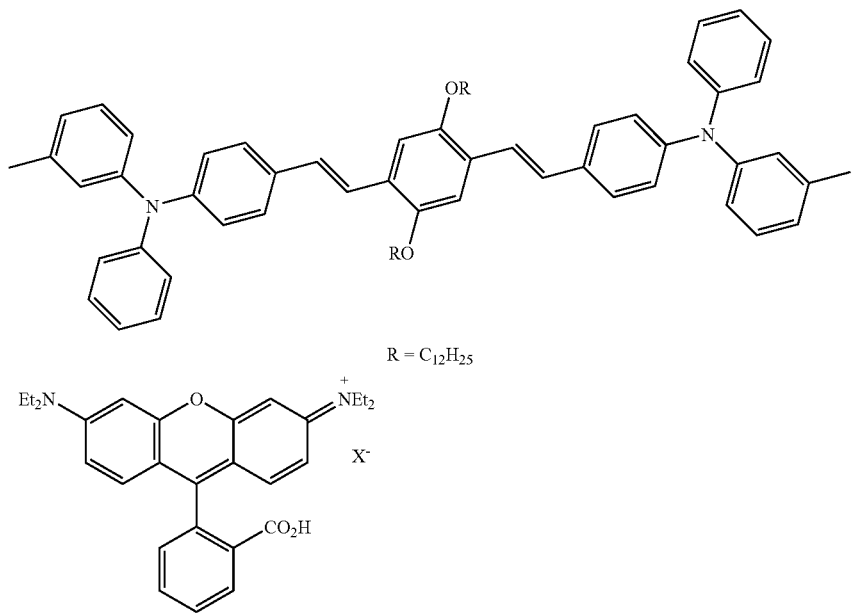

-continued

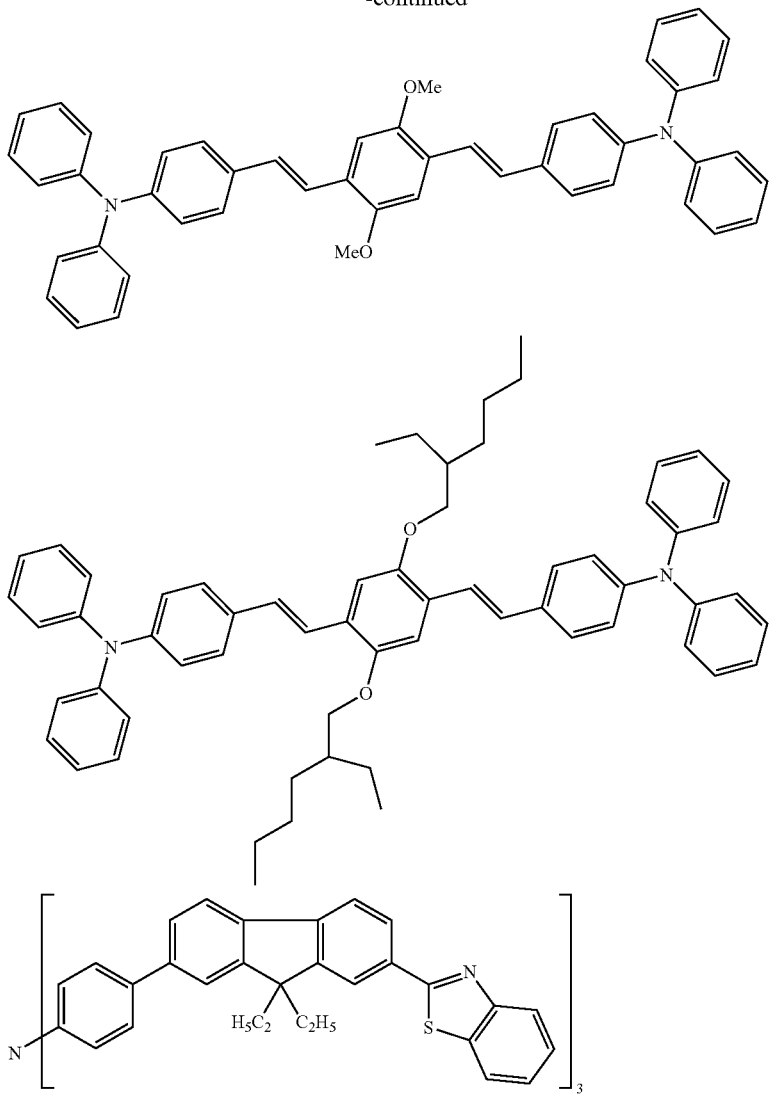

(2) Electron Donor Compounds

Electron donor compounds useful in the multiphoton photoinitiator system of the photoreactive compositions are those compounds (other than the photosensitizer itself) that are capable of donating an electron to an electronic excited state of the photosensitizer. Such compounds may be used, optionally, to increase the multiphoton photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used to guide electron donor compound selection.

Suitable electron donor compounds include, for example, those described by D. F. Eaton in *Advances in Photochemistry*, edited by B. Voman et al., Volume 13, pp. 427-488, John Wiley and Sons, New York (1986); by Oxman et al. in U.S. Pat. No. 6,025,406 at column 7, lines 42-61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photosensitivity has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include
$Ar_3B^-(n-C_4H_9)N^+(C_2H_5)_4$
$Ar_3B^-(n-C_4H_9)N^+(CH_3)_4$
$Ar_3B^-(n-C_4H_9)N^+(n-C_4H_9)_4$
$Ar_3B^-(n-C_4H_9)Li^+$
$Ar_3B^-(n-C_4H_9)N^+(C_6H_{13})_4$
$Ar_3B^-(C_4H_9)N^+(CH_3)_3(CH_2)_2CO_2(CH_2)_2CH_3$
$Ar_3B^-—(C_4H_9)N^+(CH_3)_3(CH_2)_2OCO(CH_2)_2CH_3$
$Ar_3B^--(sec-C_4H_9)N^+(CH_3)_3(CH_2)_2CO_2(CH_2)_2CH_3$
$Ar_3B^--(sec-C_4H_9)N^+(C_6H_{13})_4$
$Ar_3B^-—(C_4H_9)N^+(C_8H_{17})_4$
$Ar_3B^-—(C_4H_9)N^+(CH_3)_4$
$(p-CH_3O—C_6H_4)_3B^-(n-C_4H_9)N^+(n-C_4H_9)_4$
$Ar_3B^-(C_4H_9)N^+(CH_3)_3(CH_2)_2OH$
$ArB^-(n-C_4H_9)_3N^+(CH_3)_4$
$ArB^-(C_2H_5)_3N^+(CH_3)_4$
$Ar_2B^-(n-C_4H_9)_2N(CH_3)_4$
$Ar_3B^-(C_4H_9)N^+(C_4H_9)_4$
$Ar_4BN^+(C_4H_9)_4$
$ArB^-(CH_3)_3N^+(CH_3)_4$
$(n-C_4H_9)_4B^-N^+(CH_3)_4$
$Ar_3B^-(C_4H_9)P^+(C_4H_9)_4$
(where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate, and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators

Suitable photoinitiators (that is, electron acceptor compounds) for the reactive species of the photoreactive compositions are those that are capable of being photosensitized by accepting an electron from an electronic excited state of the multiphoton photosensitizer, resulting in the formation of at least one free radical and/or acid. Such photoinitiators include iodonium salts (for example, diaryliodonium salts), sulfonium salts (for example, triarylsulfonium salts optionally substituted with alkyl or alkoxy groups, and optionally having 2,2' oxy groups bridging adjacent aryl moieties), and the like, and mixtures thereof.

The photoinitiator is preferably soluble in the reactive species and is preferably shelf-stable (that is, does not spontaneously promote reaction of the reactive species when dissolved therein in the presence of the photosensitizer and the electron donor compound). Accordingly, selection of a particular photoinitiator can depend to some extent upon the particular reactive species, photosensitizer, and electron donor compound chosen, as described above. If the reactive species is capable of undergoing an acid-initiated chemical reaction, then the photoinitiator is an onium salt (for example, an iodonium or sulfonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as Cl$^-$, Br$^-$, I$^-$ or $C_4H_5SO_3^-$) or a metal complex salt (for example, containing $SbF_6^-$, $PF_6^-$, $BF_4^-$, tetrakis(perfluorophenyl)borate, $SbF_5OH^-$ or $AsF_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ SR 1012 available from Sartomer Company), and mixtures thereof.

Useful sulfonium salts include those described in U.S. Pat. No. 4,250,053 (Smith) at column 1, line 66, through column 4, line 2, which can be represented by the formulas:

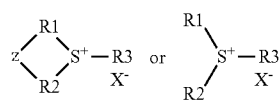

Ⓣ indicates text missing or illegible when filed wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —(R$_4$—)C(—R$_5$)—, where $R_4$ and $R_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5-bis(CF_3)C_6H_3)SO_2N—SO_2CF_3$, $C_6H_5SO_2C—(SO_2CF_3)_2$, $C_6H_5SO_2N—SO_2CF_3$, and the like. Preferred anions of this type include those represented by the formula $(RfSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5-bis(CF_3)C_6H_3)_4B^-$, $(C_6F_5)_4B^-$, $(p-CF_3C_6H_4)_4B^-$, $(m-CF_3C_6H_4)_4B^-$, $(p-FC_6H_4)_4B^-$, $(C_6F_5)_3(CH_3)B^-$, $(C_6F_5)_3(n-C_4H_9)B^-$, $(p-CH_3C_6H_4)_3(C_6F_5)B^-$, $(C_6F_5)_3FB^-$, $(C_6H_5)_3(C_6F_5)B^-$, $(CH_3)_2\beta-CF_3C_6H_4)_2B^-$, $(C_6F_5)_3(n-C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5-bis(CF_3)C_6H_3)_4B^-$, $(C_6F_5)_4B^-$, $(C_6F_5)_3(n-C_4H_9)B^-$, $(C_6F_5)_3FB^-$, and $(C_6F_5)_3(CH_3)B^-$.

Suitable anions containing other metal or metalloid centers include, for example, $(3,5-bis(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, X$^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SarCat™ SR1010 available from Sartomer Company), triarylsulfonium hexafluorophosphate (for example, SarCat™ SR 1011 available from Sartomer Company), and triarylsulfonium hexafluorophosphate (for example, SarCat™ KI85 available from Sartomer Company).

Preferred photoinitiators include iodonium salts (more preferably, aryliodonium salts), sulfonium salts, and mixtures thereof. More preferred are aryliodonium salts and mixtures thereof.

Preparation of Photoreactive Composition

The reactive species, multiphoton photosensitizers, electron donor compounds, and photoinitiators can be prepared by the methods described above or by other methods known in the art, and many are commercially available. These four components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The three components of the photoinitiator system are present in photochemically effective amounts (as defined above). Generally, the composition can contain at least about 5% (preferably, at least about 10%; more preferably, at least about 20%) up to about 99.79% (preferably, up to about 95%; more preferably, up to about 80%) by weight of one or more reactive species; at least about 0.01% (preferably, at least about 0.1%; more preferably, at least about 0.2%) up to about 10% (preferably, up to about 5%; more preferably, up to about 2%) by weight of one or more photosensitizers; optionally, up to about 10% (preferably, up to about 5%) by weight of one or more electron donor compounds (preferably, at least about 0.1%; more preferably, from about 0.1% to about 5%); and from about 0.1% to about 10% by weight of one or more electron acceptor compounds (preferably, from about 0.1% to about 5%) based upon the total weight of solids (that is, the total weight of components other than solvent).

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 Daltons; preferably between about 10,000 and 500,000 Daltons; more preferably, between about 15,000 and 250,000 Daltons). Suitable polymeric binders include, for example, polystyrene, poly(methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces (including silicon wafers and glass plates), depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

EXAMPLES

Objects and advantages of this invention are further illustrated by the following examples, but the particular materials and amounts thereof recited in these examples, as well as other conditions and details, should not be construed to unduly limit this invention. Unless otherwise noted, all procedures were carried out under a dry nitrogen atmosphere with dry and deoxygenated solvents and reagents. Unless otherwise noted, all solvents and reagents were or can be obtained from Sigma-Aldrich Corp., St. Louis, Mo.

Rhodamine B hexafluoroantimonate was prepared by metathesis of Rhodamine B chloride with sodium hexafluoroantimonate.

As used herein, "SR368" refers to tris-(2-hydroxyethyl) isocyanurate triacrylate, obtained from Sartomer Co., Inc., Exton, Pa.;

"SR9008" refers to a trifunctional acrylate ester obtained from Sartomer Co., Inc., Exton, Pa.;

"SR1012" refers to diaryliodonium hexafluoroantimonate, obtained from Sartomer Co., Inc., Exton, Pa.;

"SU-8 R2150" refers to an epoxy negative photoresist obtained from MicroChem. Corp., Newton, Mass.;

"PGMEA" refers to poly(ethylene glycol) methyl ether acetate;

"THF" refers to tetrahydrofuran;

"PHOTOMER 6210" refers to an aliphatic urethane diacrylate, manufactured by Cognis Corp. USA, Cincinnati, Ohio;

"SARTOMER 238" refers to hexanediol diacrylate, available from Sartomer Co., Inc., Exton, Pa.;

"IRGACURE 819" refers to an acylphosphine oxide photoinitiator, available from Ciba Specialty Chemicals, Tarrytown, N.Y.

"CGI 7460" refers to tetrabuytlammonium n-hexyl-tris(3-fluorophenyl) borate, obtained from Ciba Specialty Chemicals, Tarrytown, N.Y.

Example 1

Use of a Confocal Interface Locator System to Prepare a Microlens Array

A circular silicon wafer (10.2 cm (4 inches) in diameter; obtained from Wafer World, Inc., West Palm Beach, Fla.) was cleaned and prepared by soaking it for approximately ten minutes in a 3:1 volume/volume (v/v) mixture of concentrated sulfuric acid and 30 weight percent aqueous hydrogen peroxide. The wafer was then rinsed with deionized water and then with isopropanol, after which it was dried under a stream of air. The wafer was then dipped into a two weight percent solution of 3-(trimethoxysilyl)propyl methacrylate in 190-proof ethanol that had been made acidic (pH 4-5) with acetic acid. The wafer was then rinsed with absolute ethanol and was then heated in an oven at 130° C. for ten minutes.

Poly(methyl methacrylate), having a number average molecular weight of approximately 120,000, SR9008, and SR368 were combined in a weight ratio of 30:35:35 to provide a monomer mixture, and this monomer mixture was dissolved in sufficient 1,2-dichloroethane to afford a solution that was 54 weight percent of the monomer mixture. To this solution there were then added aliquots of concentrated solutions of photosensitizer dye N,N,N-tris(7-(2-benzothiazolyl)-9,9-diethyl-2-fluorenly) amine (described along with its synthesis in Example 20 of U.S. Pat. No. 6,300,502 (Kannan et al.)) in THF, SR1012 in THF, and CGI 7460 in THF, to give a coating a solution that was 0.5 weight percent photosensitizer dye (based on total weight of solids), 1.0 weight percent SR1012 (based on total weight of solids), and 0.5 weight percent CGI 7460 (based on total weight of solids). This coating solution was filtered through a 1-micron syringe filter and was spin-coated onto the silicon wafer. The wafer was placed in a forced air oven at 60° C. for 18 hours to afford a coated silicon wafer with a substantially solvent-free (hereinafter, "dry") coating thickness of approximately 20 micrometers. The uncoated side of the wafer was rinsed with isopropanol, and the wafer was then mounted on a porous carbon vacuum chuck that was itself mounted on a three-point leveling base with the uncoated side of the wafer in contact with the chuck. The leveling base was leveled by adjusting the appropriate leveling screw or screws that were set at the three adjustment points near the perimeter of the base.

Two-photon polymerization of the dry coating was carried out in the following manner, using a diode-pumped Ti:sapphire laser (Spectra-Physics, Mountain View, Calif.) operating at a wavelength of 800 nm, nominal pulse width of 80 fs, pulse repetition rate of 80 MHz, and average power of approximately 1 W. The coated wafer was placed on a computer-controllable three-axis stage (obtained from Aerotech, Inc., Pittsburgh, Pa.). The laser beam was attenuated by neutral density filters and was focused into the dry coating using a galvoscanner with telescope for x, y, and z-axis control (available from Nutfield Technology, Inc., Windham, N.H.) and a microscope objective lens (having a numeric aperture of 0.9) that was immersed in type A immersion oil (available from Cargille Laboratories, Cedar Grove, N.J.), which was applied directly on the surface of the dry coating. The average power was measured at the output of the objective lens using a wavelength-calibrated photodiode (obtained from Ophir Optronics, Ltd., Wilmington, Mass.) and was determined to be approximately 8 mW.

The two-photon photopolymerization system described above was first used with a confocal interface locator system (described below) to level the surface of the wafer (according to the procedure described below), so that it was within about 500 nanometers of the focal plane of the exposure system. The focus of the laser beam was thus maintained, with respect to the interface between the surface of the silicon wafer and the polymerizable coating, so that substantially no coating was left unpolymerized between a microlens in the array and the surface of the silicon wafer. The wafer had a slice thickness of 600 nm, a fill factor of 71.1%, an average surface roughness of 38 nm, and a sag of 8.3 μm.

The confocal interface locator system was an optical train having a beam splitter (Model 10RQ00UB.2 available from Newport Irvine, Calif.), a mirror, a 10-micrometer pinhole, a photomultiplier tube (a Model R3898 photomultiplier tube, available from Hamamatsu Corp., Bridgewater, N.J., in a Model PR1405.C6 housing, available from Products for Research, Inc., Danvers, Mass.) that was powered by a Model PS 300 DC power supply (available from Stanford Research Systems Inc., Sunnyvale, Calif.), an amplifier (Model 3312, available from Pomona Electronics, Everett, Wash.), and a multimeter (Fluke Model 73III). The two-photon photopolymerization system was activated, and the laser signal was used to detect the interface between the surface of the silicon wafer and the polymerizable coating before being used to fabricate the microlens array, as described below.

The three-point leveling base was moved so that the focused laser beam was directed at a point outside of the planned microlens array area. The focused laser signal that reflected from the surface of the silicon wafer (that is, at the interface of the coating) passed back through the galvoscanner and then through the beam splitter and was reflected by the mirror through the bandpass filter. The bandpass filter passed only the focused laser signal and not light of other wavelengths (such as the fluorescence emission from the photosensitizer in the coating on the wafer). After passing through the 10-micrometer pinhole, the focused laser signal was amplified by the photomultiplier tube, and the electrical signal from the tube was monitored as a potential (voltage) using the multimeter. The highest intensity reflected laser signal was the focused laser signal, noted as a maximum voltage on the multimeter. Voltages lower than the maximum voltage indicated that that focus of the laser was not reflected by the surface of the silicon wafer, that is, the focus of the laser was either substantially above or substantially below the interface between the coating and the wafer.

After the surface of the wafer was detected in this manner, the leveling base holding the wafer was moved under the laser, and adjustments were then made to the three-point leveling base until the focused laser beam was again reflected from the surface of the wafer, again at a point outside of the planned microlens array area, as indicated by a maximum voltage as measured using the multimeter. This process was repeated two more times to provide the surface of the silicon wafer within 500 nanometers of the optical plane of the exposure system.

Two-photon polymerization of the dry coating was then carried out using essentially the system and procedure described above, so as to produce a resulting hexagonal-packed array of 1760 by 2490 aspherical, radially symmetric microlenses was approximately 4.4 cm by 4.4 cm in size.

The hexagonal-packed array of 1760 by 2490 microlenses was then used as a masterform in a process to replicate the array. A two-part silicone resin (RTV 61 SAIB, available from GE Silicones, Waterford, N.Y.) was used to make a silicone mold of the microlens array. Ten parts by weight of RTV 615A were stirred with one part by weight of RTV 615B for approximately 30 minutes. An aluminum ring having a height of approximately 14.3 millimeters (0.56 inch) and a diameter larger than the largest dimension of the microlens array was placed over the array. The silicone mixture was then poured over the array and was contained by the aluminum ring. The resulting sample was then placed in a vacuum chamber and was held at a pressure of approximately 4000 Pa (30 mmHg) for approximately one hour. The sample was then placed in a forced air oven at a temperature of 55° C. for approximately 100 minutes. The sample was then allowed to cool to room temperature, and the resulting cured silicone resin was removed from the microlens array masterform to afford a silicone mold of the microlens array.

A mixture of IRGACURE 819 (0.3 g) and SARTOMER 238 (5.0 g) was filtered through a 0.2-micrometer syringe filter and was combined with PHOTOMER 6210 (15.0 g), which had been heated to approximately 55° C. for approximately 30 minutes. The resulting curable mixture was poured into the silicone mold, and the filled silicone mold was then placed in a vacuum chamber and was held at a pressure of approximately 4000 Pa (30 mmHg) for approximately 45 minutes. The filled silicone mold was then placed on a glass plate such that the curable mixture was in contact with the glass plate. Light hand pressure was briefly applied to the top of the silicone mold. The curable mixture was irradiated using a H-type bulb in a Model DRS-120 ultraviolet processor (available from Fusion UV Systems, Inc., Gaithersburg, Md.). The filled silicone mold was passed through the processor (with the silicone mold facing the ultraviolet bulb) seven times at a processor (belt) speed of 4.5m (15 feet) per minute. The filled silicone mold was then allowed to cool to room temperature, after which time the silicone mold was removed from the resulting cured mixture to afford a replica of the microlens array.

Example 2

Use of a Confocal Locator System to Prepare a Tilted Microlens Array

A circular silicon wafer (10.2 cm (4 inches) in diameter; obtained from Wafer World, Inc., West Palm Beach, Fla.) was cleaned and prepared essentially as described in Example 1.

Poly(methyl methacrylate), having a number average molecular weight of approximately 120,000, SR9008, and SR368 were combined in a weight ratio of 30:35:35 to provide a monomer mixture, and this monomer mixture was dissolved in sufficient 1,2-dichloroethane to afford a solution that was 54 weight percent of the monomer mixture. To this solution there were then added aliquots of concentrated solutions of photosensitizer Rhodamine B hexafluoroantimonate in THF and SR1012 in THF sufficient to give a coating solution that was 0.5 weight percent Rhodamine B hexafluoroantimonate and 1.0 weight percent SR1012, based on the total weight of solids. This coating solution was filtered through a 1-micron syringe filter and was spin-coated onto the silicon wafer. The wafer was placed in a forced air oven at 60° C. for 18 hours to afford a coated silicon wafer with a substantially solvent-free (hereinafter, "dry") coating thickness of approximately 300 micrometers. The two-photon photopolymerization system essentially described in Example 1, except that a microscope objective lens having a numeric aperture of 1.4 was used, was then used with the confocal interface locator system described in Example 1 to prepare a three by three array of tilted microlenses (slice thickness of 560 nm).

Example 3

Use of a Confocal Locator System to Prepare a Hexagonal-Packed Microlens Array

A coated silicon wafer was prepared essentially as described in Example 2, except that the coating thickness of the monomer mixture was approximately 10 micrometers. The two-photon photopolymerization system described in Example 2 was then used with the confocal interface locator system described in Example 1 to prepare an array of 2273 by 3214 aspherical, radially symmetric microlenses was approximately 5.0 cm by 5.0 cm in size (fill factor of 91.8 percent; sag of 8.3 microns).

Various embodiments of the invention have been described.

These and other embodiments are within the scope of the following claims.

The invention claimed is:

1. A method, comprising:
providing a substrate having thereon a layer comprising a multiphoton curable photoreactive composition;
applying a light beam to at least one region of the layer, wherein the light beam cures or initiates cure of the multiphoton curable photoreactive composition; and
processing a portion of the light beam reflected off the substrate to obtain a location signal of an interface between the layer and the substrate at each region.

2. The method of claim 1, wherein the light beam cures the multiphoton curable reactive composition in the region after the processing step to form a cured object.

3. The method of claim 1, wherein the light beam cures the composition in the region prior to or at the same time as the processing step to form a cured object.

4. The method of claim 1, wherein the light beam is focused as it is applied to the at least one region of the layer.

5. The method of claim 1, wherein the region is adjacent to the substrate.

6. The method of claim 1, wherein the location of the interface in each region is determined within a range of 100 nm to 1 μm.

7. The method of claim 1, wherein the location signal is obtained from an optical apparatus comprising at least one of a confocal interface locator system, an interferometric detector, and a split detector focus measurement system.

8. The method of claim 7, wherein the optical apparatus comprises a confocal interface locator system.

9. The method of claim 1, wherein the substrate is a silicon wafer.

10. The method of claim 2, further comprising removing from the substrate at least a portion of a cured material.

11. The method of claim 3, further comprising removing from the substrate at least a portion of the cured material.

12. A method, comprising:
providing a substrate having thereon a layer comprising a multiphoton curable photoreactive composition;

applying through a first optical system a light beam to at least a first region of the layer;

reflecting a portion of the light beam off the substrate at each first region to provide a reflected light beam;

processing the reflected light beam at each first region in a second optical system comprising an optical detector, wherein an output of the optical detector comprises a location signal of an interface between the substrate and the layer at each first region; adjusting the first optical system in response to the location signal; and applying through the first optical system the light beam to cure the composition in a curing region.

13. The method of claim 12, wherein the curing region is different from the first region.

14. The method of claim 12, wherein the composition in the first region is cured prior to or at the same time as the processing step.

15. The method of claim 12, wherein the signal is continuously applied to the first optical system as the light beam is applied to the curing region.

16. The method of claim 12, wherein the location of the interface at the first region is determined within a range of 100 nm to 1 μm.

17. The method of claim 12, wherein the optical detector comprises at least one of a confocal interface locator system, an interferometric detector, and a split detector focus measurement system.

18. The method of claim 17, wherein the optical apparatus is a confocal interface locator system.

19. The method of claim 12, wherein the light beam is a focused laser beam.

20. The method of claim 12, wherein the substrate is a silicon wafer.

21. A method comprising
providing a layer on a substrate, wherein the layer comprises a multiphoton curable photoreactive composition, and wherein the substrate is on an adjustable platform;

applying through a first optical system a light beam to the layer in at least a first region;

processing the light beam in a second optical system comprising an optical detector, wherein an output of the optical detector comprises a location signal for an interface between the substrate and the layer at each region;

adjusting at least one of the first optical system and the platform in response to the signal;

curing the composition with the light beam in a curing region.

22. The method of claim 21, wherein the curing region is different from the first region.

23. The method of claim 21, wherein the adjusting step comprises altering the height of the first optical system with respect to the platform.

24. The method of claim 21, wherein the adjusting step comprises altering the height of the platform with respect to the first optical system.

25. The method of claim 21, wherein the light beam cures a first region of the composition prior to or at the same time as the processing step.

26. The method of claim 21, wherein at least one of the platform and the first optical system are continuously adjusted as the light beam is applied to the curing region.

27. The method of claim 21, wherein the light beam is applied to the layer at differing first, second and third regions, a location signal is obtained of an interface between the substrate and the layer at each region, a combined location signal is generated based on the location signals generated at each of the first, second and third regions, and at least one of the first optical system and the platform are adjusted based on the combined location signal.

28. A computer readable medium comprising instructions for causing a processor to:
receive a location signal of an interface between a substrate and at least one region of a layer comprising a multiphoton curable photoreactive composition, wherein the location signal is generated by applying a focused light beam to the layer through a first optical system and processing in an optical detector a portion of the focused light beam reflected off the substrate;

generate a combined location signal based on the location signals generated at each region; and adjust, based on the combined location signal, at least one of the first optical system and a platform supporting the substrate.

29. The computer readable medium of claim 28, wherein the combined location signal is based on at least three location signals.

30. The computer readable medium of claim 28, wherein the combined location signal is based on one location signal.

31. The computer readable medium of claim 28, wherein the optical detector is a confocal interface locator system.

32. An apparatus for curing a region of a layer comprising a multiphoton curable photoreactive composition, wherein the apparatus comprises a first optical system that directs a first portion of a focused laser beam into the layer, and a second optical system that processes a second portion of the beam as reflected off the substrate to produce an output signal of an interface between the substrate and the layer.

33. The apparatus of claim 32, wherein the first optical system comprises a beam splitter and a positive lens.

34. The apparatus of claim 32, wherein the second optical system comprises an optical detector selected from one of a confocal interface locator system, an interferometric detector, and a split detector focus measurement system.

35. The apparatus of claim 34, wherein the optical detector is a confocal interface locator system.

* * * * *

UNITED STATES PATENT AND TRADEMARK OFFICE
CERTIFICATE OF CORRECTION

PATENT NO.         : 7,893,410 B2
APPLICATION NO.    : 12/158143
DATED              : February 22, 2011
INVENTOR(S)        : Sykora et al.

It is certified that error appears in the above-identified patent and that said Letters Patent is hereby corrected as shown below:

Column 7,
Line 60, Delete "414;" and insert -- 414, --, therefor.

Column 8,
Line 11, Delete "3M," and insert -- 3M Attorney docket number 60893US002, --, therefor.

Column 10,
Line 14, Delete "MicroChem." and insert -- MicroChem --, therefor.

Column 11,
Line 36, Delete "MicroChem." and insert -- MicroChem --, therefor.

Line 60, Delete "acid-" and insert -- acid --, therefor.

Column 14,
Line 12, Delete "98121521" and insert -- 98/21521 --, therefor.

Line 16, Delete "(i)" and insert -- (pi) --, therefor.

Line 42 (Including Structure), Delete "X-" and insert -- X⁻ --, therefor.

Column 18,
Line 14, Delete "N(CH$_3$)$_4$" and insert -- N$^+$(CH$_3$)$_4$ --, therefor.

Line 16, Delete "Ar$_4$BN$^+$" and insert -- Ar$_4$B$^-$N$^+$ --, therefor.

Signed and Sealed this
Twenty-first Day of June, 2011

David J. Kappos
*Director of the United States Patent and Trademark Office*

CERTIFICATE OF CORRECTION (continued)

Column 19,
Line 11, Delete "SO₃—)" and insert -- $SO_3^-$) --, therefor.

Line 58, Below

" 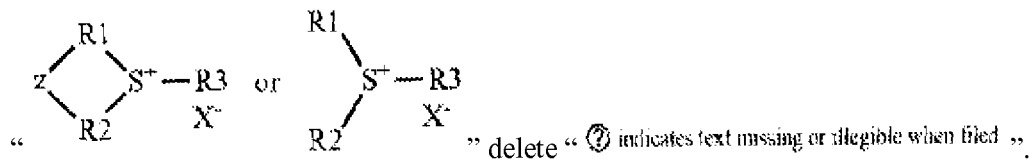 " delete " (?) indicates text missing or illegible when filed ".

Column 20,
Line 25, Delete "C₆H₅SO₂C—" and insert -- $C_6H_5SO_2C^-$ --, therefor.

Line 26, Delete "C₆H₅SO₂N—" and insert -- $C_6H_5SO_2N^-$ --, therefor.

Line 28, Delete "(RfSO₂)₃" and insert -- $(R_fSO_2)_3$ --, therefor.

Line 34, Delete "(CH₃)₂β-" and insert -- $(CH_3)_2$(p- --, therefor.

Line 44, Delete "F₄P—," and insert -- $F_4P^-$, --, therefor.

Line 44, Delete "F₅P—," and insert -- $F_5P^-$, --, therefor.

Column 22,
Line 65, Delete "MicroChem." and insert -- MicroChem --, therefor.

Column 25,
Line 8, Delete "61 SAIB," and insert -- 615A/B, --, therefor.